US010932398B2

(12) United States Patent
Ghosh

(10) Patent No.: US 10,932,398 B2
(45) Date of Patent: Feb. 23, 2021

(54) ELECTROMAGNETIC INTERFERENCE (EMI) SHIELDING PRODUCTS USING TITANIUM MONOXIDE (TIO) BASED MATERIALS

(71) Applicant: 3M INNOVATIVE PROPERTIES COMPANY, St. Paul, MN (US)

(72) Inventor: Dipankar Ghosh, Oakdale, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 158 days.

(21) Appl. No.: 15/102,863

(22) PCT Filed: Dec. 11, 2014

(86) PCT No.: PCT/US2014/069787
§ 371 (c)(1),
(2) Date: Jun. 8, 2016

(87) PCT Pub. No.: WO2015/094915
PCT Pub. Date: Jun. 25, 2015

(65) Prior Publication Data
US 2016/0309628 A1    Oct. 20, 2016

Related U.S. Application Data

(60) Provisional application No. 61/985,124, filed on Apr. 28, 2014, provisional application No. 61/917,661, filed on Dec. 18, 2013.

(51) Int. Cl.
*H05K 9/00* (2006.01)
*C08K 3/22* (2006.01)

(52) U.S. Cl.
CPC ............ *H05K 9/0083* (2013.01); *C08K 3/22* (2013.01); *H05K 9/0081* (2013.01); *C08K 2003/221* (2013.01); *C08K 2003/2206* (2013.01); *C08K 2003/2237* (2013.01); *C08K 2003/2265* (2013.01); *C08K 2003/2289* (2013.01)

(58) Field of Classification Search
CPC ...................................................... C08K 3/22
See application file for complete search history.

(56) References Cited

U.S. PATENT DOCUMENTS

| | | | |
|---|---|---|---|
| 3,671,275 A | 6/1972 | Louis | |
| 4,568,603 A | 2/1986 | Oldham | |
| 5,019,681 A * | 5/1991 | Lorence | B65D 81/3446 219/730 |
| 5,188,992 A * | 2/1993 | Nishimura | C04B 35/493 501/136 |
| 5,284,807 A * | 2/1994 | Komori | C03C 3/091 501/35 |
| 5,691,498 A | 11/1997 | Fogle, Jr. | |
| 7,804,439 B2 * | 9/2010 | Yoshida | H05K 9/0003 342/1 |
| 2001/0029228 A1 * | 10/2001 | Terashi | C03C 10/0045 501/32 |
| 2001/0051286 A1 * | 12/2001 | Oiri | G11B 5/73 428/845.4 |
| 2002/0022142 A1 * | 2/2002 | Harada | C08K 3/04 428/493 |
| 2002/0022190 A1 * | 2/2002 | Iizuka | G03G 9/0819 430/110.4 |
| 2002/0051724 A1 * | 5/2002 | Kida | C22C 1/1036 419/19 |
| 2005/0003199 A1 * | 1/2005 | Takaya | B32B 15/08 428/413 |
| 2005/0180790 A1 * | 8/2005 | Mizumoto | G03G 21/0058 399/357 |
| 2006/0092079 A1 * | 5/2006 | de Rochemont | H01Q 1/362 343/700 MS |
| 2007/0267603 A1 * | 11/2007 | Takagi | B82Y 10/00 252/511 |
| 2009/0101873 A1 | 4/2009 | Tan | |
| 2009/0123186 A1 * | 5/2009 | Sugiura | G03G 9/0806 399/223 |
| 2009/0186290 A1 * | 7/2009 | Yoshizaki | G03G 9/0806 430/109.1 |

(Continued)

FOREIGN PATENT DOCUMENTS

CN    102318460 A    1/2012
CN    103250478 A    8/2013

(Continued)

OTHER PUBLICATIONS

Valeeva, A. A., A. A. Rempel, and A. I. Gusev. "Electrokinetic and magnetic properties of cubic titanium monoxide with a double-defect structure." Doklady Physics. vol. 47. No. 1. 2001 (Year: 2001).*
Valeeva et al. "Electrical Conductivity and Magnetic Susceptibility of Titanium Monoxide." JETP Letters. vol. 73. No. 11, 2001. (Year: 2001).*
"3M AB-5000 EMI Absorber", Data Sheet, 2006, pp. 2.
Barba, "Carbon black/silicone rubber blends as absorbing materials to reduce Electro Magnetic Interferences (EMI)", Polymer Bulletin, 2006, vol. 57, pp. 587-593.
Chung, "Electrical permittivity and conductivity of carbon black-polyvinyl chloride composites", Journal of Applied Physics, 1982, vol. 53, pp. 6867-6879.

(Continued)

*Primary Examiner* — Megan McCulley

(57) ABSTRACT

Compositions (120), which may be in the form of flexible films, molded bodies, or printable inks, can incorporate ceramic particles (122) comprising titanium monoxide (TiO) for purposes of electromagnetic interference (EMI) shielding at megahertz through gigahertz frequencies. One or more additional ceramic particles can also be included. The compositions comprise a composite material (120) which includes the ceramic particles (122) dispersed within a matrix material (121), such as a polymer. Methods associated with such compositions are also described.

18 Claims, 9 Drawing Sheets

(56) References Cited

U.S. PATENT DOCUMENTS

| | | | | |
|---|---|---|---|---|
| 2010/0143008 | A1* | 6/2010 | Mizumoto | G03G 15/0233 399/286 |
| 2010/0294559 | A1 | 11/2010 | Izawa | |
| 2010/0315105 | A1 | 12/2010 | Fornes | |
| 2011/0200740 | A1 | 8/2011 | Ma | |
| 2011/0227796 | A1* | 9/2011 | Kuroda | C01G 23/00 343/700 MS |
| 2013/0237400 | A1* | 9/2013 | Letz | C03B 32/02 501/32 |
| 2013/0255393 | A1* | 10/2013 | Fukuzawa | G01L 1/12 73/779 |
| 2014/0154465 | A1* | 6/2014 | Sun | H01L 21/6831 428/137 |
| 2014/0159325 | A1* | 6/2014 | Parkhe | H01L 21/67109 279/128 |
| 2016/0044838 | A1* | 2/2016 | Aga | H05K 9/0075 252/62 |
| 2016/0276072 | A1* | 9/2016 | Sethumadhavan | H01F 1/0315 |

FOREIGN PATENT DOCUMENTS

| | | |
|---|---|---|
| EP | 2 505 618 A1 | 10/2012 |
| WO | WO 2012/092200 A2 | 7/2012 |
| WO | WO 2014-099389 | 6/2014 |
| WO | WO 2014-130431 | 8/2014 |

OTHER PUBLICATIONS

Device Technologies, "Shield-Fast™ EMI/RFI Shielding: FA Series RF Absorber Materials," 2013, pp. 1-3.

Gregorio Jr., "Effect of Crystalline Phase, Orientation and Temperature on the Dielectric Properties of Poly (Vinylidene Fluoride) (PVDF)", Journal of Materials Science, 1999, vol. 34, pp. 4489-4500.

Banus, "Electrical and Magnetic Properties of TiO and VO", Physical Review B, 1972, vol. 5, pp. 2775-2784, XP055176418.

Nanda, "Dielectric Relaxation of Conductive Carbon Black Reinforced Chlorosulfonated Polyethylene Volcanizes", Polymer Composites, 2010, vol. 31, pp. 152-162.

Nath, "An Electronically Tunable Microstrip Bandpass Filter Using Thin-Film Barium-Strontium-Titanate (BST) Varactors", IEEE Transactions on Microwave Theory and Techniques, 2005, vol. 53, No. 9, pp. 2707-2712.

Ram, "Microstructure and Topological Analysis of Co:$Al_2O_3$ Nanocermets in New FCC and BCC Metastable Co-structures", Journal of Materials Science, 2001, vol. 36, pp. 3745-3753.

Youngs, "Dielectric Relaxation in Metal-Coated Particles: the dramatic role of nano-scale coatings", Journal of Applied Physics, 2005, vol. 38, pp. 188-201.

International Search report for PCT International application No. PCT/US2014/069787, dated Mar. 23, 2015, 4 pages.

\* cited by examiner

ELECTROMAGNETIC INTERFERENCE (EMI) SHIELDING PRODUCTS USING TITANIUM MONOXIDE (TIO) BASED MATERIALS

FIELD OF THE INVENTION

This disclosure relates generally to compositions including articles, molded bodies, and printable inks, that can be used to reduce electromagnetic interference (EMI) when applied to a workpiece such as an electrical or electronic circuit, circuit component, or enclosure containing such a circuit or circuit component. The disclosure also relates to associated articles, systems, and methods.

BACKGROUND

Electronic devices, such as those found in computers, microprocessors, calculators, watches, radios, televisions, mobile phones, vehicle ignition systems, word processors, and the like, are often sensitive to electromagnetic interference (EMI). The EMI may originate from a variety of sources, including in many cases the electrical sources and electronic devices themselves. Radio, television, and other communication systems are also sources of EMI which can disrupt the functioning of the electronic devices, causing diminished performance or even device failure.

To ensure normal operation of the electronic devices, it is desirable and sometimes necessary to block, i.e., substantially reduce, the undesired EMI. The blocking may be for the purpose of reducing the amount of EMI radiating outwardly from a given circuit or circuit component, reducing the amount of EMI radiating inwardly towards the circuit or circuit component from other sources, or both. The blocking, also known as shielding, can be achieved by reflection of the EMI, absorption of the EMI, or a combination of both. In one common approach, a metal sheet or foil known as an EM shield, which has high electrical conductivity, is used to reflect the undesired EMI. Reflecting the EMI may, however, in some cases be insufficient and may cause further problems. Also, eddy currents can reduce the metal's effectiveness as a shielding material at very high frequencies, such as gigahertz (GHz) frequencies. In another approach, materials or structures may be used that predominantly absorb, rather than reflect, the unwanted EMI.

BRIEF SUMMARY

Ceramics are not usually associated with high dielectric loss in the radio frequency or microwave ranges. They are instead generally considered to be good electrically insulating materials. However, we have found that certain ceramic materials, in particular titanium monoxide (TiO), either alone or in combination with one or more additional components, can provide a surprisingly high dielectric loss, magnetic loss, or both, even at gigahertz (GHz) frequencies. The TiO, either alone or in combination with one or more additional components, can be dispersed as particulates in a matrix material to produce composite materials that can be shaped, coated, printed, molded, or otherwise used in various product configurations for the purpose of mitigating EMI.

Compositions, as well as products such as flexible films, molded bodies, and printable inks can incorporate ceramic particles comprising titanium monoxide (TiO) and, when used, the one or more additional components, to provide substantial electromagnetic interference (EMI) mitigation at megahertz through gigahertz frequencies. The films and bodies, as well as the printed inks after the removal of solvent, comprise a composite material which includes the ceramic TiO particles and, when used, the one or more additional components, dispersed within a matrix material, such as a polymer. The composite material may have a loss tangent, such as a dielectric loss tangent, a magnetic loss tangent, or both, of at least 0.03, or at least 0.1, or at least 0.3, or at least 0.4 over a frequency range from 1 GHz to 5 GHz. A component of the loss tangent due to the ceramic particles may be at least 0.01, or at least 0.05, or at least 0.1 over such frequency range. The dielectric loss tangent is a measure of how much a material absorbs or dissipates electromagnetic radiation, and is discussed further below.

We describe herein, inter alia, compositions, articles, and inks that include a composite material for mitigating EMI. The composite material includes a matrix material and ceramic particles dispersed within the matrix material, and the ceramic particles are or include titanium monoxide (TiO).

The ceramic particles may constitute a portion of the composite material, the portion being at least 10 vol. %, or at least 15 vol. % but no more than 60 vol. %, or at least 25 vol. % but no more than 50 vol. %. The composite material may have a dielectric loss tangent of at least 0.03, or at least 0.1, or at least 0.3, or at least 0.4, over a range from 1 GHz to 5 GHz.

The dielectric loss tangent of the composite material may have a first loss tangent component due to the ceramic particles and a second loss tangent component due to the matrix material, and the first loss tangent component may be at least 0.1, or at least 0.2, or at least 0.3, over the range from 1 GHz to 5 GHz. The second loss tangent component may be at least 0.01, or at least 0.05, over the range from 1 GHz to 5 GHz.

The matrix material may be or include a polymeric matrix material, and the polymeric matrix material may be or include a fluorocarbon-based polymer, a chlorine-containing polymer, a (meth) acrylate polymer, a silicone, an epoxy-based polymer, a polyether polymer, a copolymer thereof, or a combination thereof. The polymeric matrix material may be or include a fluorocarbon-based polymer or copolymer, and the fluorocarbon-based polymer or copolymer may be or include a polyvinylidene fluoride (PVDF) polymer or copolymer. The fluorocarbon-based polymer or copolymer may be or include a terpolymer of tetrafluoroethylene, hexafluoropropylene, and vinylidene fluoride.

The article may be or include a cable having one or more conductive lines, one or more of which may be at least partially surrounded by an EMI shielding layer, the EMI shielding layer comprising the composite material. The article may be or include a flexible EMI shielding layer that comprises the composite material, and such article may further include a film that carries the EMI shielding layer. The article may also be or include a rigid/molded body having a contoured shape.

We also describe inks suitable for printing on a workpiece to mitigate electromagnetic interference (EMI), the ink including a matrix solution and ceramic particles dispersed within the matrix solution, where the ceramic particles are or include titanium monoxide (TiO). The matrix solution may be or include a polymer dissolved in a solvent, and the polymer may be or include a fluorocarbon-based polymer or copolymer. The fluorocarbon-based polymer or copolymer may, in turn, be or include a polyvinylidene fluoride (PVDF) polymer or copolymer.

The ink may be configured to produce, after the solvent is removed, a solid and/or cured composite material having the polymer as a matrix material and the ceramic particles dispersed in the matrix material, the solid/cured composite material having a dielectric loss tangent of at least 0.03, or at least 0.1, or at least 0.3, or at least 0.4, over a range from 1 GHz to 5 GHz. The ceramic particles may make up a portion of the solid/cured composite material, the portion being at least 10 vol. %, or at least 15 vol. % but no more than 60 vol. %, or at least 25 vol. % but no more than 50 vol. %.

Related methods, systems, and articles are also discussed.

These and other aspects of the present application will be apparent from the detailed description below. In no event, however, should the above summaries be construed as limitations on the claimed subject matter, which subject matter is defined solely by the attached claims, as may be amended during prosecution.

BRIEF DESCRIPTION OF DRAWINGS

In the figures, like reference numerals designate like elements.

DETAILED DESCRIPTION

As used herein, the term "TiO" refers to the chemical titanium monoxide, and not to a subunit of titania, $TiO_2$, or titanium dioxide. Thus, a composition containing titanium dioxide does not necessarily contain TiO, and would not typically contain TiO unless TiO is also added to the composition as a separate material from the titanium dioxide.

Composite materials can be used to make EMI shielding films, tapes, molded bodies, inks, and other products that are useful at least at frequencies of one to several gigahertz, as well as at lower frequencies (e.g. 10 MHz to 950 MHz or to 1 GHz) and higher frequencies (e.g. up to 60 GHz, for example, in a range from 1 to 60 GHz). The composite materials can provide significant attenuation of unwanted electromagnetic radiation or EMI at such frequencies due to the substantial dielectric loss tangent of the material, which we have measured. The composite materials comprise particles dispersed in a matrix material, and the particles, which are typically responsible for the great majority of the overall dielectric loss of the composite material, can be made of an inorganic, ceramic material, most commonly titanium monoxide (TiO).

The TiO can be used either alone or in conjunction with one or more additional components. The additional components can be substances that attenuate EMI, enhance the EMI attenuating effects of TiO, or both. Exemplary additional components include nanosilica, such as hydrophobic nanosilica (i.e. nanosilica with a hydrophobic surface modifier), carbonyl iron, $Ba_3Co_3Fe_{24}O_{41}$, and $Y_3Fe_5O_{12}$.

Figure 1:
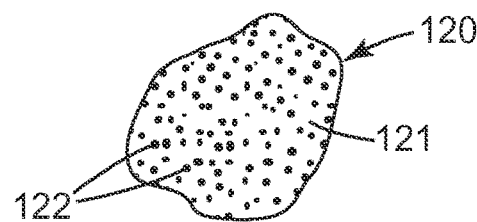
FIG. 1 is a schematic view of a composite material having ceramic TiO particles dispersed in a matrix material.

A representative EMI attenuating material is shown schematically as composite material 120 in FIG. 1. The composite material 120 may consist of, or may consist essentially of, or may simply comprise, along with one or more other constituent elements, ceramic particles 122 dispersed in a matrix material 121. One or more additional components (not shown) may also be included, typically in particulate of powder form.

For optimal effectiveness, the particles 122 may be composed entirely of pure TiO, keeping in mind that other elements or compounds may also be present as impurities in such particles. In other cases, the particles 122 may not be pure TiO (as in the case of doped TiO or reduced TiO). When doped TiO is used, the dopant can be any suitable dopant, such as one or more of Cu, Co, Ni, Cr, Mn, Mo, Nb, V Fe, Ru, Au Ag, Pt, N, S, C, B, P, I, and F. When the TiO is doped, the doping levels can vary widely, such as from 20 ppm or 50 ppm to 5 wt. % of the TiO or 5 wt % of the TiO. When the TiO is reduced, the resulting material will be non-stoichiometric, having a ratio of Ti:O of less than 1.

The particles 122 need not have any particular shape, size, or size distribution, but may have a variety of shapes and sizes. In some cases, the particles 122 may be at least approximately spherical. The particles 122 may have particle sizes, or an average particle size, no less than 20 nm, no less than 30 nm, no less than 40 nm, no less than 50 nm, no less than 75 nm, no less than 100 nm, no less than 250 nm, no less than 375 nm, or no less than 0.5 microns, and no more than 100 microns, no more than 75 microns, no more than 60 microns, no more than 50 microns, or no more than 40 microns. Typically, the particle sizes, or an average particle size, is in a range from 50 nm to 50 microns, more typically from 0.5 microns to 10 microns. Importantly, shapes other than spheres and sizes other than those mentioned can also be used. In order to provide a significant amount of dielectric loss at high frequencies, the particles 122 are present in the composite material 120 in an amount that is more than merely a trace amount. For example, the particles 122 may comprise or make up a portion of the composite material 120, and the portion is typically at least 10, 15, 20, 25, 30, or 35 volume percent (vol. %) of the composite material, but is also typically no more than 60, 55, 50, 45, or 40 vol. % of the composite material. The particles 122 may thus, for example, make up at least 15 but no more than 60 vol. %, or at least 25 but no more than 50 vol. %, of the composite material 120.

The matrix material 121 may be any suitable material in which the particles 122 can be dispersed. The matrix material is typically a solid, but in some cases a liquid matrix material may be used. Polymeric materials are often particularly suitable due to their cost, availability, and desirable material properties for many applications. If the matrix material 121 is a polymer, in exemplary embodiments, it may be or include a fluorocarbon-based polymer, a chlorine-containing polymer, a (meth) acrylate polymer, silicone, an epoxy-based polymer, a polyether polymer, a copolymer thereof, or a combination thereof. In cases where the polymeric matrix material comprises a fluorocarbon-based polymer or copolymer, the fluorocarbon-based polymer or copolymer may be or include a polyvinylidene fluoride (PVDF) polymer or copolymer, and/or a terpolymer of tetrafluoroethylene, hexafluoropropylene, and vinylidene fluoride.

Although polymeric materials are often desirable for use as the matrix material 121, they are not required in all cases, and non-polymeric materials may also be used depending upon the end-use application.

Depending on the exact form the composite material 120 takes, it may exhibit absorption of EMI, reflection of EMI, or both. This, it is convenient to characterize the material 120 in terms of its dielectric loss, and in particular, its dielectric loss as expressed in terms of its dielectric loss tangent. The dielectric loss tangent is a measure of a material's ability to dissipate electromagnetic energy into heat. If the permittivity $\varepsilon$ of the material is expressed in terms of its real component $\varepsilon'$ and its imaginary component $\varepsilon''$, where $\varepsilon = \varepsilon' - i\varepsilon''$, the dielectric loss tangent "tan $\delta$" (also referred to herein as "tan d") is given as:

$$\tan \delta = \varepsilon''/\varepsilon'.$$

Similarly, for magnetic materials, the permeability of a material can be defined in terms of real part of permeability ($\mu'$) and imaginary part of permeability ($\mu''$). Thus, a magnetic loss tangent (tan $\delta_m$) representing the magnetic loss is a measure of a magnetic material's ability to dissipate incoming electromagnetic energy into heat. A magnetic loss tangent can be defined as:

$$\tan \delta_m = \mu''/\mu'.$$

The loss dielectric and magnetic tangents of most materials generally decrease with increasing electromagnetic frequency, which is why finding a material with a substantial loss tangent at gigahertz frequencies can be challenging.

The disclosed composite materials are capable of exhibiting a substantial loss tangent, such as a dielectric loss tangent, magnetic loss tangent, or both dielectric and magnetic loss tangent, at high frequencies, e.g. at gigahertz frequencies. The loss tangent of the composite material 120 thus, for example, may be at least 0.03, or at least 0.1, or at least 0.3, or at least 0.4, over a frequency range from 1 GHz to 60 GHz, 1 GHz to 40 GHz, 1 GHz to 20 GHz, 1 GHz to 15 GHz, 1 GHz to 10 GHz, or 1 GHz to 5 GHz. The ceramic particles are typically responsible for the great majority of the overall dielectric and magnetic loss of the composite material, hence, the loss tangent of the material 120 can be tailored by appropriate selection of the concentration of the ceramic particles 122 in the matrix material 121.

The dielectric loss tangent of the composite material 120 may be considered to be made up of at least two parts: a first loss tangent component due to the ceramic particles 122, and a second loss tangent component due to the matrix material 121. When the material 120 includes other dielectrically lossy constituents, such as additional ceramic materials, the loss tangent of the composite material 120 equals the first loss tangent (of the ceramic particles 122) plus the second loss tangent (of the matrix material 121), plus the loss tangent of the additional ceramic materials (not shown). In some cases the matrix material 121 may not contribute significantly to the overall dielectric loss of the composite material 120, while in other cases, such as where a dielectrically lossy polymer or another dielectrically lossy material is used as the matrix material 121, it may contribute significantly. For example, fluorocarbon-based polymers (such as PVDF) or other dielectrically lossy polymers or other materials used as the matrix material 121 may have a loss tangent (a second loss tangent component) of at least 0.01, or at least 0.05, over the range from 1 GHz to 5 GHz. Alternatively, the matrix material 121 may have a negligible dielectric loss at such frequencies. In contrast, the ceramic particles 122 may provide a loss tangent (a first loss tangent component) of at least 0.1, or at least 0.2, or at least 0.3, over any of the 1 GHz to 30 GHz, 1 GHz to 25 GHz, 1 GHz to 20 GHz, 1 GHz to 15 GHz, 1 GHz to 10 GHz, or 1 GHz to 5 GHz frequency range.

The composite material, with the added ceramics, such as TiO and, in some cases, one or more additional components, can attenuate electromagnetic radiation or energy over a broad frequency range, such as from greater than 0 GHz to 80 GHz, from 1 GHZ to 40 GHz, from 1 GHz to 25 GHz, from 1 GHz to 20 GHz, from 1 GHz to 15 GHz, from 1 GHz to 10 GHz, or from 1 GHz to 5 GHz. Additional frequencies that can be affected are sub-gigahertz frequencies, which include 13.56 MHz, which is used for radio frequency identification (RFID) products and systems, the 88 MHz to 108 MHz band, which is used for FM radio broadcasting, and a band from 850 MHz to 900 MHz, which is used by some cell phones. Frequencies above 5 GHz include 5.8 GHz, which is used for toll collection, 20 GHz, which is used for standard 40 GHz bit rate data transfer, a band from 57 GHz to 63 GHz (60 GHz±3 GHz), which is used for unlicensed short range data links, and a band from 24 GHz to 77 GHz, which is used in some car collision avoidance radar systems.

For some applications, a device that can attenuate the incoming electromagnetic energy over a narrow frequency range in the GHz frequency band is desirable. Devices that have this property are sometimes known as notch filters, band-stop filters, or band-rejection filters, and can be used to block the passage of incoming EM energy over a pre-determined band of frequencies, while allowing incoming EM waves at frequencies above or below the pre-determined band of frequencies. Such notch filters can take advantage of resonance phenomena in one or more dielectric loss mechanisms, for example, the response of a dielectric medium to an external electric field of microwave frequencies.

The effectiveness of the TiO and combinations of TiO and additional ceramic materials at attenuating EMI is surprising because ceramics are generally considered to be good insulating materials. Without wishing to be bound by theory, the suitability of TiO for the disclosed EMI shielding applications is believed to be due at least in part to its high structural vacancies and defects in both titanium and oxygen sublattices, which contribute to relatively high dielectric loss, and relatively high electrical conductivity. Even more surprising is that significant dielectric loss has been demonstrated at high frequencies. Because dielectric loss was previously believed to decrease with increasing frequency for most materials, the finding that ceramic particles can attenuate EMI at frequencies in the GHz range was particularly surprising and unexpected.

In addition to the matrix material 121 and the ceramic particles 122, the composite material 120 can include other constituent components for functional or aesthetic purposes. Exemplary components include the one or more additional ceramic particles discussed herein. Also, the composite material 120 can include conductive particles such as metal particles, metal alloy particles, carbon fibers, carbon bubbles and carbon foams, carbon nanotubes, metal nanoparticles, metal nanowires, graphite, graphene-based materials (including exfoliated graphite nanoplatelets, doped and undoped graphene, graphene nanoplatelets, reduced graphene oxide, functionalized graphene sheets, and combinations thereof), and insulating particles with conductive coatings such as metal-coated glass bubbles. When used, such components are typically present in no less than 5%, 10%, 15%, 20%, 30%, or 40% by weight or by volume of the TiO, and no more than about 70%, 80%, 90%, 100%, 125%, 150%, 175%, 200%, 225%, or 250% by weight or volume of the TiO. However, other amounts can also be used depending on the application and desired properties.

The composite materials 120 can also include additional components. One type of additional component is can be ceramics such as CuO, SiC, TiN, and the like, which can increase the overall dielectric loss tangent of the composite.

Another type of additional component that can be included in the composite material 120 are magnetic materials with ferromagnetic properties, ferrimagnetic properties, or both ferromagnetic and ferrimagnetic properties. Such additional components can include one or more of Sendust (an alloy containing about 85% iron, 9.5% silicon and 5.5% aluminum), Carbonyl Iron $(Fe(CO)_5)$, Permalloy (an alloy with about 20% iron and 80% nickel), ferrites, for example, one or more of Mn—Zn ferrite, Ni—Zn ferrite, Mn—Mg—Zn ferrite, Mn—Cu—Zn ferrite, Ba-ferrite, and Sr-ferrite, and garnets, for example, YIG (Yttrium Iron garnet), GdIG (Gadolinium Iron Garnet).

When used, such additional components are typically present in no less than 5%, 10%, 15%, 20%, 30%, or 40% by weight or by volume of the TiO, and no more than about 70%, 80%, 90%, 100%, 125%, 150%, 175%, 200%, 225%, or 250% by weight or volume of the TiO. However, other amounts can also be used depending on the application and desired properties.

These additional components can increase both the dielectric loss tangent and the magnetic loss tangent of the composite 120. This can be advantageous for certain applications, in particular, high frequency EMI applications that can benefit from have a composite that has both high dielectric and magnetic loss tangent for enhanced EMI performance for both near and far field EMI applications.

Furthermore, the material 120 can include at least one of one or more dyes and one or more pigments to provide a desirable colored appearance. The material 120 may also include suitable dispersants and surfactants for optimum dispersion of the TiO, and, where used, the one or more additional components, in the matrix.

The composite material 120 may be shaped, coated, printed, molded, or otherwise used in a wide variety of product configurations all of which can be useful for mitigating EMI. Some representative products are shown and described in connection with FIGS. 2 through 6B. The reader will understand that any or all of the characteristics, features, and options discussed in connection with the composite material 120 can be used in any of these various product embodiments.

Figure 2:
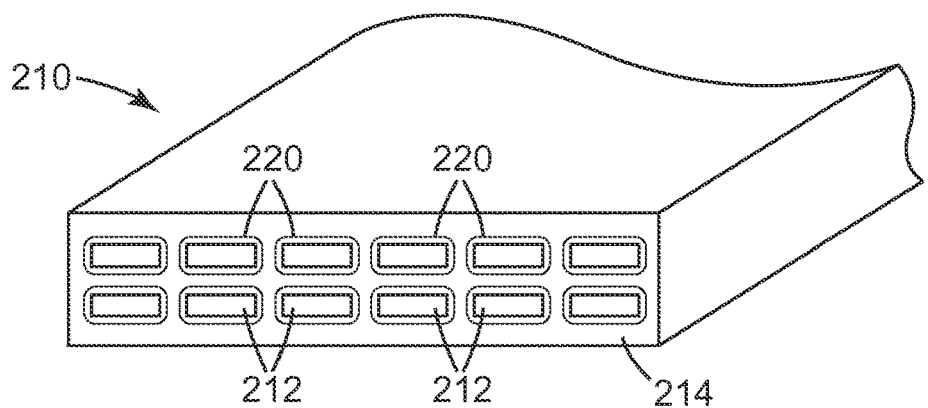
FIG. 2 is a schematic perspective view of a portion of a high density connector cable for high speed data transfer applications, where each of the signal conductors is surrounded by an EMI shielding layer.

A high density connector cable 210 is shown in FIG. 2. The cable 210, which may for example be used as a connector cable for high speed data transfer applications, includes a plurality of metal signal conductors 212 that span the length of the cable 210, the conductors 212 being embedded in, and held in place by, a flexible insulator 214 such as a low dielectric loss polymer. The conductors 212 may be configured as differential pairs for data transfer, or in any other desired way. Although twelve conductors 212 are shown and arranged in two rows of six, fewer or greater than twelve conductors can be used, and they can be arranged in different numbers of rows and columns. In one such alternative embodiment, the cable may have only one conductor, or only two conductors. In order to reduce the influence of EMI on the transmitted signals, and/or to reduce the amount of EMI emitted by the cable 210, each of the conductors 212 is surrounded by an EMI shielding layer 220, where it is understood that the shielding layers 220 are made of the composite material 120. The shielding layers 220 may for example be extruded through a die during the fabrication of the cable 210. When viewed in cross-section perpendicular to the length of the cable 210, the shielding layers 220 are shown as completely surrounding their respective conductors 212, but in alternative embodiments a given shielding layer may surround a set of two or more conductors, and in still other embodiments the shielding layers may only partially surround one, two, or more of the conductors. The partial surrounding may be realized, for example, by an EMI shielding layer that, in perpendicular cross-section, spans a given row of two or three conductors or more, but that undulates periodically in a v-shape between adjacent conductors 212 so as to partially surround each conductor.

Figure 3A:
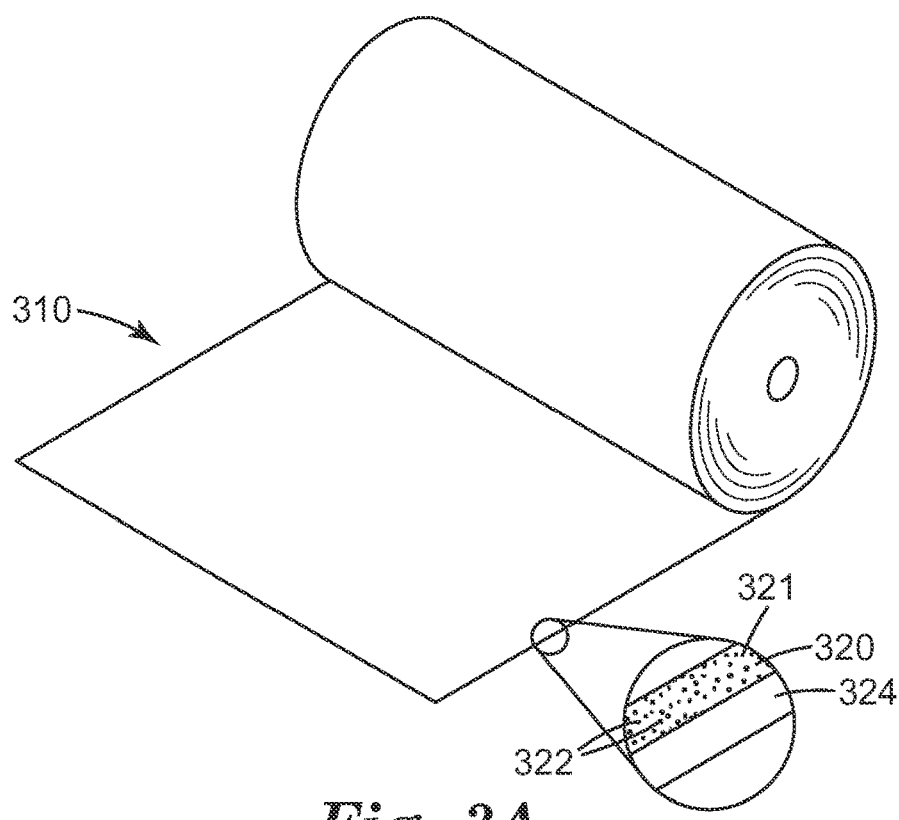
FIG. 3A is a schematic perspective view (with magnified inset) of a flexible EMI shielding film that includes a layer of composite material.

A flexible EMI shielding film 310 is shown in FIG. 3A. The film 310 includes an EMI shielding layer 320, and an optional layer 324. The EMI shielding layer 320 is made of a composite material that may be the same as or similar to composite material 120, and thus is shown as having ceramic particles 322 dispersed in a matrix material 321, the ceramic particles 322 assumed to comprise TiO. The film 310 and the layer 320 have respective thicknesses and material compositions that allow them to flex, hence, the film 310 is flexible and is shown wound up into a film roll. In some embodiments, the optional layer 324 may be omitted such that the film 310 is made up of only the EMI shielding layer 320. In other embodiments, the optional layer 324 may be included. The optional layer 324 attaches to the shielding layer 320 and may, for example, be or comprise a carrier film that carries the EMI shielding layer 320, or an adhesive layer, or a release liner. The optional layer 324 is typically made of another polymer material, but alternative materials may also be used. In still other embodiments, the film 310 may include additional layers of polymers or other materials.

Figure 3B:
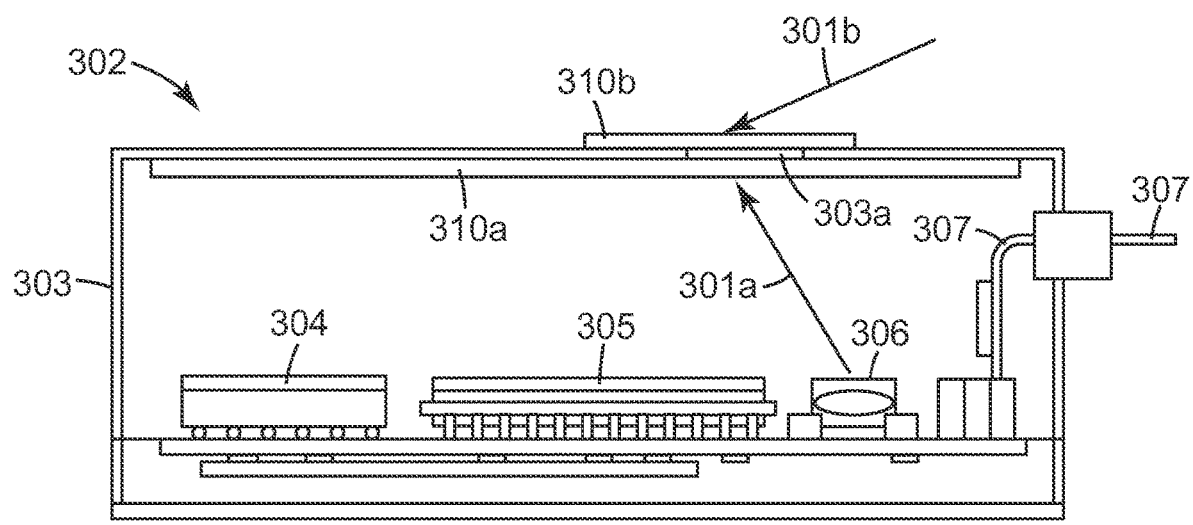
FIG. 3B is a schematic side or sectional view of an enclosure (e.g. part of a microelectronic board) to which an EMI shielding film such as that of FIG. 3A has been applied.

The flexible EMI shielding film 310, or a variation thereof, may be used as a tape from which one or more pieces can be cut and adhered to a workpiece such as a circuit, circuit component, or enclosure containing such a circuit or circuit component, for purposes of mitigating EMI. In this regard, FIG. 3B shows a schematic view of an enclosure 303 of a microelectronic board to which an EMI shielding film (or films) such as that of FIG. 3A has been applied. The enclosure 303 houses a circuit that includes some integrated circuits (ICs) 304, 306 and a large scale integrated circuit (LSI) 305, coupled to each other via a circuit board. These devices as well as the circuit itself may include other electronic circuit components such as processors, coprocessors, memory devices, transistors, resistors, capacitors, inductors, transmission lines, and conductors. A cable 307 couples the circuit to one or more other devices. The enclosure 303 may be made of any suitable material, e.g. a thick metal to shield EMI by reflection. However, the enclosure has an aperture 303a which can allow EMI from the circuit to radiate outwardly (see arrow 301a), and can also allow EMI originating from external sources to enter the enclosure 303 and disrupt the circuit (see arrow 301b). To mitigate such problems associated with the aperture 303a, a first EMI shielding film 310a and/or a second EMI shielding film 310b can be applied to the enclosure 303 to cover the aperture 303a. The shielding films 310a, 310b may be the same as or similar to the EMI shielding film 310 discussed above. Furthermore, if both shielding films 310a, 310b are used, such films may be the same, or different.

Figure 4:
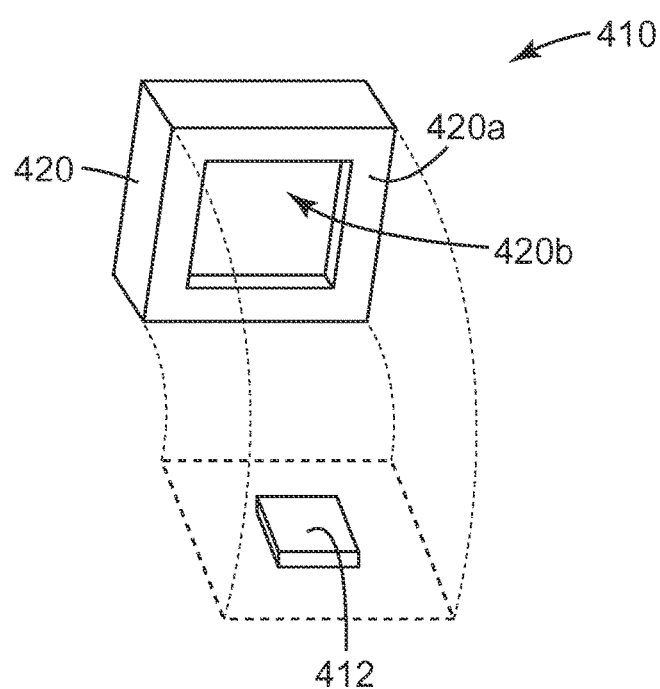
FIG. 4 is a schematic perspective view of a rigid/molded EMI shielding body having a contoured shape to allow it to cover, and partially surround, an electronic component.

The composite materials disclosed herein can also be molded into rigid or flexible bodies of various sizes, shapes, and configurations for the purpose of EMI mitigation. Often, the molded body has a contoured shape so that it can partially enclose or otherwise cover a circuit, circuit component, or other device. Such a body is shown in FIG. 4. In that figure, a system 410 includes an EMI shielding body 420 and an electronic circuit component 412. The component 412 may be attached to a circuit board or other substrate by any known means, e.g., by surface mount technology. The body 420 is sized and shaped to fit over the component 412. In this regard, the body 420 has a lower surface 420a that is contoured to form a shallow cavity 420b which may mate with or otherwise receive the circuit component 412 when the body 420 is placed atop the component 412, as indicated in the figure. In some cases, the body 420 may be formed in situ over the circuit component 412 by a molding process. The body 420 is made of a composite material that may be the same as or similar to composite material 120, and includes TiO ceramic particles. Due to the substantial dielectric loss of the composite material, the body 420 effectively absorbs or otherwise blocks EMI from external sources that may interfere with the operation of the circuit component 412, as well as EMI that may be emitted by the component 412.

Figure 5A:
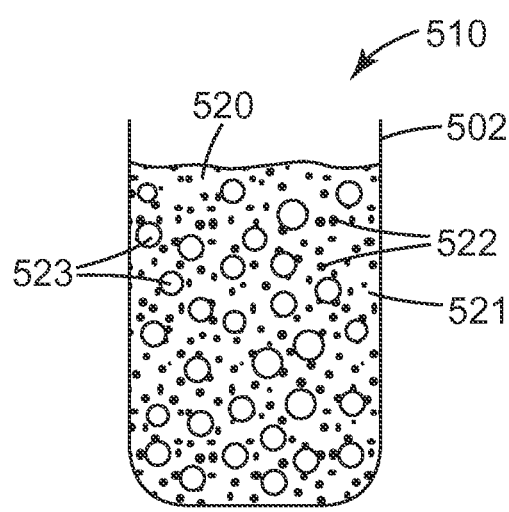
FIG. 5A is a schematic side or sectional view of a container of printable ink in which polymer particles are not fully dissolved in the liquid solvent, the ink also including EMI-mitigating ceramic filler particles.
Figure 5B:
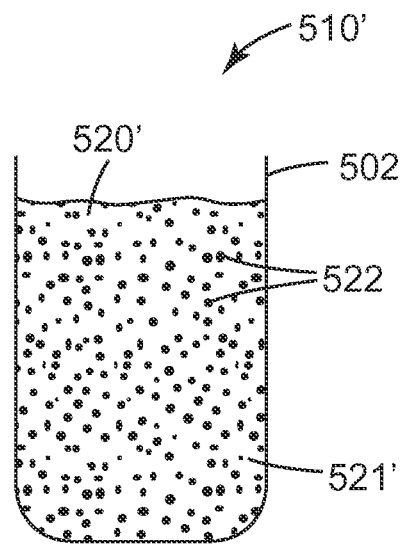
FIG. 5B is a schematic view of the same container showing the printable ink that results after the polymer particles have dissolved in the solvent to provide a polymer solution, the ink again including the ceramic filler particles.

Still another form which the disclosed composite materials can take is an ink, as shown schematically in FIGS. 5A and 5B. In FIG. 5A, a product 510 includes a container 502 that holds a printable ink 520. The ink 520 includes a solvent 521 within which are dispersed ceramic particles 522 and polymer particles 523. The ceramic particles 522 are made of or include TiO, and may be the same as or similar to the ceramic particles 122 discussed above. The polymer particles 523 are made of, or include, pieces of polymer material. The polymer material may be the same as or similar to any of the polymer materials discussed above in connection with the matrix material 121. Thus, the polymer material of the polymer particles 523 may be or include, for example, a fluorocarbon-based polymer, a chlorine-containing polymer, a (meth) acrylate polymer, silicone, an epoxy-based polymer, a polyether polymer, a copolymer thereof, or a combination thereof. In cases where the polymer material comprises a fluorocarbon-based polymer or copolymer, the fluorocarbon-based polymer or copolymer may be or include a polyvinylidene fluoride (PVDF) polymer or copolymer, and/or a terpolymer of tetrafluoroethylene, hexafluoropropylene, and vinylidene fluoride. The solvent 521 may be any suitable solvent, and in exemplary embodiments it is a liquid in which the polymer particles 523 can dissolve. Typical solvents include dimethylformamide (DMF), N-methyl-2-pyrrolidone (NMP), isopropanol (IPA), tetrahydrofuran (THF), benzene, and acetone, but these should not be considered as limiting. The ink 520 may also include other constituent components, such as one or more dyes and/or pigments to impart a desired color to the ink. The ink 520 may also include purely conductive particles such as any of those mentioned above in connection with the composite material 120. Furthermore, the ink may include suitable dispersants and surfactants for optimum dispersion of the fillers in the polymer solution.

In cases where the polymer particles 523 are allowed to dissolve in the solvent 521, the ink 520 may be a precursor or intermediate product which then becomes a finished ink after the polymer particles have dissolved. Such a finished ink 520' is shown as a finished product 510' in FIG. 5B. Similar to FIG. 5A, the ink 520' is resident in the same container 502 and contains the same ceramic particles 522 as the precursor ink 520. In place of the solvent 521 and polymer particles 523 of FIG. 5A, the ink 520' contains a "syrup" or polymer solution 521', which may be a liquid mixture of the solvent 521 and polymer chains that originated from the (now dissolved) polymer particles 523.

The inks of FIGS. 5A and 5B may be printed, coated, sprayed, or otherwise applied to a surface of interest such as a circuit, circuit component, container, film, substrate, or other workpiece of interest, and then dried to produce a finished (solid) composite material. The concentration of the ceramic particles 522 in the original ink can be tailored so that the cured (dry or solid) composite material has a dielectric loss tangent of at least 0.15, or at least 0.2, or at least 0.3, or at least 0.4, over a range from 1 GHz to 5 GHz. To achieve these results the ceramic particles may make up a portion of the dry composite material, the portion being at least 10 vol. %, or at least 15 vol. % but no more than 60 vol. %, or at least 25 vol. % but no more than 50 vol. %.

Figure 6A:
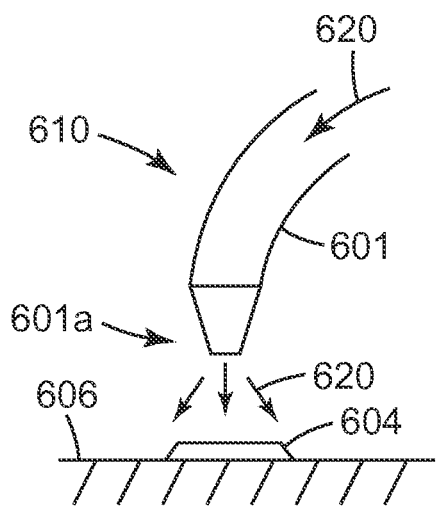
FIG. 6A is a schematic side or sectional view of a printing station at which a nozzle delivers a coating of the printable ink into a workpiece of interest, such as an electronic component.
Figure 6B:
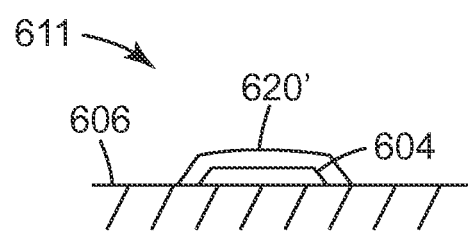
FIG. 6B is a similar view of the workpiece after the layer of coated ink has been allowed to solidify and/or cure.

FIGS. 6A and 6B show how the inks can be applied to an electronic circuit component and then dried. In FIG. 6A, a circuit component 604 mounted to a circuit board or other substrate 606 is positioned near a nozzle 601 at a printing station 610. The nozzle 601 connects to a supply of ink in liquid form such as ink 520 or ink 520', and dispenses the ink from an outlet 601a of the nozzle 601, the ink flowing through the nozzle and exiting the outlet as indicated by the arrows 620. The dispensed ink thus forms a liquid coating, film, or layer on the component 604. If desired, relative motion can be provided between the workpiece (e.g., the substrate 606 or component 604) and the nozzle 601 while the ink is being dispensed (whether continuously or intermittently) so as to form a plurality of distinct coatings and/or an extended coating of the dispensed ink. In FIG. 6B, the dispensed ink forms a coating 620' atop the component 604 at a station 611, which may be the same as the coating station 610 or a separate drying station. The coating 620' in the figure represents the coated ink after drying and after removal of the solvent, but it may alternatively represent the coated ink while the ink is still wet before removal of the solvent. In either case, the coating 620' provides substantial EMI mitigation at high frequencies for the circuit component 604 or for any other workpiece to which it is applied.

Various articles, inks, and methods are also provided. For example, the items enumerated below illustrate particular, non-limiting embodiments to aid in the understanding of this disclosure.

Item 1 is a composition comprising a composite material for mitigating electromagnetic interference (EMI), the composite material comprising: a matrix material; and ceramic particles dispersed within the matrix material; wherein the ceramic particles comprise titanium monoxide (TiO).

Item 2 is the composition of item 1, wherein the composite material comprises from 10 vol. % to 60 vol. %, of the ceramic particles.

Item 3 is the composition of any of the preceding items, wherein the composite material comprises from 15 vol. % to 60 vol. % of the ceramic particles.

Item 4 is the composition of any of the preceding items, wherein the composite material comprises from 25% to 50 vol. % of the ceramic particles.

Item 5 is the composition of any preceding item, wherein the composite material has a dielectric loss tangent of at least 0.15.

Item 6 is the composition of any preceding item, wherein the composite material has a dielectric loss tangent of at least 0.2.

Item 7 is the composition of any preceding item, wherein the composite material has a dielectric loss tangent of at least 0.3.

Item 8 is the composition of any preceding item, wherein the composite material has a dielectric loss tangent of at least 0.4.

Item 9 is the composition of any of items 4 to 7, wherein the dielectric loss tangent has a first loss tangent component due to the ceramic particles and a second loss tangent component due to the matrix material, and wherein the first loss tangent component is at least 0.1.

Item 10 is the composition of any of items 4 to 8, wherein the dielectric loss tangent has a first loss tangent component due to the ceramic particles and a second loss tangent component due to the matrix material, and wherein the first loss tangent component is at least 0.2.

Item 11 is the composition of any of items 4 to 9, wherein the dielectric loss tangent has a first loss tangent component due to the ceramic particles and a second loss tangent component due to the matrix material, and wherein the first loss tangent component is at least 0.3.

Item 12 is the composition of any of items 4 to 10, wherein the second loss tangent component is at least 0.01.

Item 13 is the composition of any of items 4 to 11, wherein the second loss tangent component is at least 0.05.

Item 14 is the composition of any of items 4 to 12, wherein the dielectric loss tangent has a first loss tangent component due to the ceramic particles and a second loss tangent component due to the matrix material, and wherein the second loss tangent component is at least Item 15 is the composition of any of items 4 to 14, wherein the dielectric loss tangent is over a range from 1 GHz to 60 GHz.

Item 16 is the composition of any of items 4 to 15, wherein the dielectric loss tangent is over a range from 1 GHz to 25 GHz, Item 17 is the composition of any of items 4 to 16, wherein the dielectric loss tangent is over a range from 1 GHz to 15 GHz.

Item 18 is the composition of any of items 4 to 16, wherein the dielectric loss tangent is over a range from 1 GHz to 10 GHz.

Item 19 is the composition of any of items 4 to 16, wherein the dielectric loss tangent is over a range from 1 GHz to 5 GHz.

Item 20 is the composition of any of the preceding items, further comprising one or more additional components.

Item 21 is the composition of any of the preceeding items, wherein the one or more additional components include at least one of magnetic materials and conductive materials.

Item 22 is the composition of any of items 20-21, wherein one or more additional components include at least one of nanosilica, carbonyl iron, $Ba_3Co_3Fe_{24}O_{41}$, $Y_3Fe_5O_{12}$, and colloidal silica.

Item 23 is a composition of item 22, wherein the nanosilica is hydrophobic nanosilica.

Item 24 is a composition of item 22, wherein one or more additional components include carbonyl iron.

Item 25 is a composition of item 22, wherein one or more additional components include $Ba_3Co_3Fe_{24}O_{41}$.

Item 26 is a composition of item 22, wherein one or more additional components include $Y_3Fe_5O_{12}$.

Item 27 is a composition of item 22, wherein one or more additional components include colloidal silica.

Item 28 is the composition of any preceding item, wherein the matrix material comprises a polymeric matrix material.

Item 29 is the composition of item 28, wherein the polymeric matrix material comprises a fluorocarbon-based polymer, a chlorine-containing polymer, a (meth) acrylate polymer, silicone, an epoxy-based polymer, a polyether polymer, a copolymer thereof, or a combination thereof.

Item 30 is the composition of item 28, wherein the polymeric matrix material comprises a fluorocarbon-based polymer or copolymer.

Item 31 is the composition of item 30, wherein the fluorocarbon-based polymer or copolymer comprises a polyvinylidene fluoride polymer or copolymer.

Item 32 is the composition of item 30, wherein the fluorocarbon-based polymer or copolymer comprises a terpolymer of tetrafluoroethylene, hexafluoropropylene, and vinylidene fluoride.

Item 33 is the composition of any preceding item, wherein the composition is present as an EMI shielding layer that at least partially surrounds one or more conductive lines of a cable comprising the one or more conductive lines Item 34 is the composition of any preceding item, wherein the composition is present as a component of a flexible EMI shielding layer.

Item 35 is the composition of item 33, further comprising a film for carrying the EMI shielding layer.

Item 36 is a composition of any preceding item, wherein the composition is in the form of a rigid body having a contoured shape.

Item 37 is a composition of any of the preceding items in the form of an ink for mitigating electromagnetic interference that is adapted for printing on a workpiece.

Item 38 is a composition of item 36, wherein the matrix material comprises a polymer and wherein the matrix material is present in a solvent.

Item 39 a composition of item 38, wherein the polymer comprises a fluorocarbon-based polymer or copolymer.

Item 40 is a composition of item 39, wherein the fluorocarbon-based polymer or copolymer comprises a polyvinylidene fluoride polymer or copolymer.

Item 41 is a composition any of items 38 to 40, wherein the ink is configured to produce, after the solvent is removed, a solid or cured composite material having the polymer as a matrix material and the ceramic particles dispersed in the matrix material, the solid composite material, cured composite material, or cured solid composite material having a dielectric loss tangent of at least 0.15 over a range from 1 GHz to 25 GHz.

Item 42 is composition of item 41, wherein the solid or cured composite material comprises at least 10 vol. % ceramic particles.

Item 43 is a composition of any of the preceding items, wherein the composition has a magnetic loss tangent of at least 0.01.

Item 44 is a composition of any of the preceding items, wherein the composition has a magnetic loss tangent of at least 0.03.

Item 45 is a composition of any of the preceding items, wherein the composition has a magnetic loss tangent of at least 0.05.

Item 46 is a composition of any of the preceding items, wherein the composition has a combined dielectric and magnetic loss tangent of at least 0.01.

Item 47 is a composition of any of the preceding items, wherein the composition has a combined dielectric and magnetic loss tangent of at least 0.03.

Item 48 is a composition of any of the preceding items, wherein the composition has a combined dielectric and magnetic loss tangent of at least 0.05.

Item 49 is a composition of any of the preceding items, wherein the composition is a component of a notch filter for EMI suppression.

Item 50 is a method of shielding an electronic device from electromagnetic interference, comprising: providing an electronic device; and placing article composition of any of the preceding claims in proximity to the electronic device.

Item 50a is the method of item 50, wherein the placing comprises forming an EMI shielding article in situ proximate the electronic device.

Item 51 is the method of item 50, wherein the placing comprises providing an ink and applying the ink in proximity to the electronic device.

Item 52 is the method of item 51, wherein the applying the ink comprises coating the electronic device with the ink.

Item 53 is the method of item 51, wherein the placing comprises providing an EMI shielding tape and taking a piece from the EMI shielding tape for use as the EMI shielding article.

Item 54 is the method of item 49, wherein the placing comprises adhering the EMI shielding article to the electronic device.

Item 55 is the method of item 49, wherein the placing comprises covering the electronic device with the EMI shielding article.

Item 56 is the method of item 49, wherein the placing comprises at least partially surrounding the electronic device with the EMI shielding article in at least one cross-sectional plane.

Item 57 is the method of item 56, wherein the placing comprises completely surrounding the electronic device with the EMI shielding article in the at least one cross-sectional plane.

Item 58 is the method of item 49, wherein the composite material further comprises at least one of one or more dyes and one or more pigments.

Item 59 is the method of any of items 49 to 58, wherein the composite material further comprises at least one conductive particle.

Item 60 is the method of item 59, wherein the conductive particles comprise one or more of metal particles, metal alloy particles, carbon fibers, carbon bubbles and carbon foams, carbon nanotubes, metal nanoparticles, metal nanowires, graphite, graphene-based materials (including exfoliated graphite nanoplatelets, doped and undoped graphene, graphene nanoplatelets, reduced graphene oxide, functionalized graphene sheets, and combinations thereof), and insulating particles with conductive coatings.

Item 61 is the method of any of items 49 to 60, wherein the electronic device comprises one or more electronic circuits and/or one or more electronic circuit components.

Item 62 is the method of item 61, wherein the electronic device comprises an electronic circuit component, and the electronic circuit component comprises one or more integrated circuits (ICs), large scale integrated circuits (LSIs), processors, coprocessors, memory devices, transistors, resistors, capacitors, inductors, transmission lines, and/or conductors.

Item 563 is an article or system produced by the method of any of the items 49 to 62.

EXAMPLES

The foregoing principles were used to fabricate several articles made of a composite material which included the TiO filler particles to provide substantial dielectric loss tangents at high frequencies. The materials used were as follows:

| Material | Description |
| --- | --- |
| TiO | Titanium monoxide, 99.5% powder, obtained from Alfa Aesar, Ward Hill, MA |
| PVDF | Polyvinylidene fluoride, obtained from Durel Corp., Chandler, AZ under trade designation "Hylar ® SN" |
| Paraffin | Powder, obtained from Avantor Performance Materials Inc., NJ |
| CALWAX 8345 | Microcrystalline wax powder, obtained from Calwax, Irvindale, CA under trade designation "CALWAX 8345". |
| Fluorosurfactant FC-4430 | Non-ionic, polymeric fluorosurfactant obtained from 3M Company, St. Paul, MN under trade designation "3M ™ Fluorosurfactant FC-4430". |
| Epoxy | Rapid curing, general purpose adhesive/encapsulant, obtained from ITW Devcon, Danvers, MA under trade designation "5 MINUTE EPOXY". |
| CIP | Carbonyl iron powder, EW-I grade, obtained from, BASF Corp., Evans City, PA |
| $Co_2Z$ ferrite | $Ba_3Co_2Fe_{24}O_{41}$ powders, obtained from Trans-Tech, Adamstown, MD. |
| YIG | $Y_3Fe_5O_{12}$ powders, obtained from Alfa Aesar, Ward Hill, MA. |
| Colloidal silica | 5 nm size, 16. 06 wt. % in water, obtained from NALCO Inc., Bedford Park, IL under trade designation "NALCO . . . " |
| Isoctyltrimethoxysilane | Obtained from Gelest, Inc., Morrisville, PA. |
| Methyltrimethoxysilane | Obtained from Gelest, Inc., Morrisville, PA. |
| Ethanol | Obtained from EMD Gibbstown, NJ. |
| Methanol | Obtained from VWR, Chester, PA. |
| Hydrophobic nanosilica | was prepared from a mixture of 100 grams of colloidal silica, 7.54 grams of isoctyltrimethoxy silane, 0.81 grams of methyltrimethoxysilane and 112.5 grams of an 80:20 wt/wt. % solvent blend of ethanol:methanol which were added to a 500 mL 3-neck round bottom flask (Ace Glass, Vineland, N.J.). The flask containing the mixture was placed in an oil bath set at 80° C. with stirring for 4 hours to prepare hydrophobically modified nanosilica particles. The hydrophobically modified nanosilica particles were transferred to a crystallizing dish and dried in a convection oven at 150° C. for 2 hours. |

Example 1: Composites with Wax Matrix Material and Dielectrically Lossy TiO Fillers As-received TiO powders were ground manually in a mortar and pestle to eliminate any large agglomerates. A stoichiometric amount of the TiO powder was dry mixed with a wax mixture (a blend of CALWAX 8345 and paraffin at 4:1 wt. ratio, respectively) in a SPEEDMIXER (Model DAC 150.1 FVZ, obtained from FlacTek Inc., Landrum, S.C.). The resulting mixture was placed in an oven pre-set at 150° C. for 10 minutes. Once the wax was molten, the mix was then poured into an aluminum weighing pan. Once the mold was cold and hardened into a solid, a pellet of the resulting composite material was taken out. The amount of TiO in the composite was about 57.8 wt. %, which corresponds to about 20 vol. % loading. The composite pellet was then cut into a toroidal body for dielectric co-axial measurements. The toroidal body had an outer diameter of 2.54 cm, an inner diameter of 1.10 cm, and a thickness (or height or length) of 3 to 4 mm. Complex dielectric properties were calculated over the GHz frequency range using an Agilent E8363C Network Analyzer (obtained from Agilent Technologies, Santa Clara, Calif.) coupled to a Damaskos Model 100T Air Coaxial test fixture (obtained from Damaskos Inc., Concordville, Pa.).

Figure 7A:
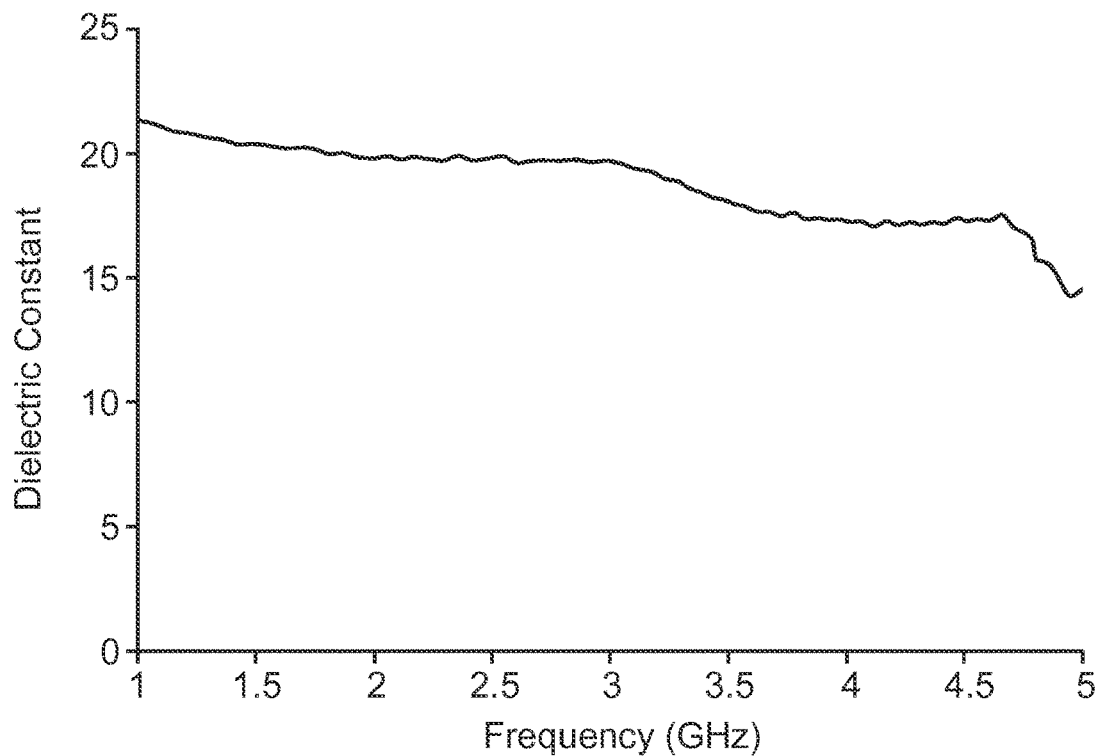
FIG. 7A is a graph showing the measured dielectric constant versus frequency for a body made from a composite material having wax as the matrix material and TiO ceramic particles dispersed therein at 20 vol. %.

The dielectric constant (Dk) of the TiO/wax composites ranged from about 20-21 at low gigahertz frequencies (e.g. 1-2 GHz) to about 15 at higher gigahertz frequencies (e.g. 5 GHz), as shown in FIG. 7A. The dielectric constant (Dk) of the paraffin wax by itself, with no TiO filler, was about 2.2 over the same gigahertz frequency range.

Figure 7B:
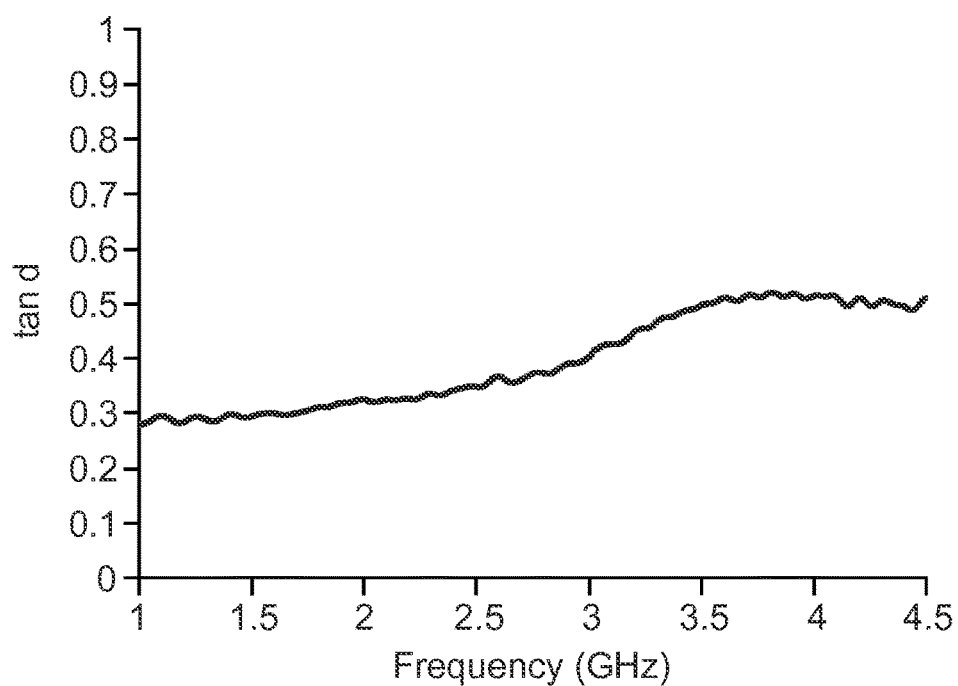
FIG. 7B is a graph showing the measured dielectric loss tangent versus frequency for the same body as that of FIG. 7A.

The Example 1 sample exhibited a dielectric loss tangent (tan d) of about 0.3 at 1 GHz, and about 0.5 at 5 GHz, as shown in FIG. 7B. Such a dielectric loss tangent is high enough to be useful for shielding and absorbing materials as it pertains to EMI. The dielectric loss tangent of the paraffin wax by itself, with no TiO filler, was about 0.002-0.005 over the same gigahertz frequency range. Thus, the TiO filler is almost solely responsible for the high dielectric loss tangent of the composite material as shown in FIG. 7B.

Figure 7C:
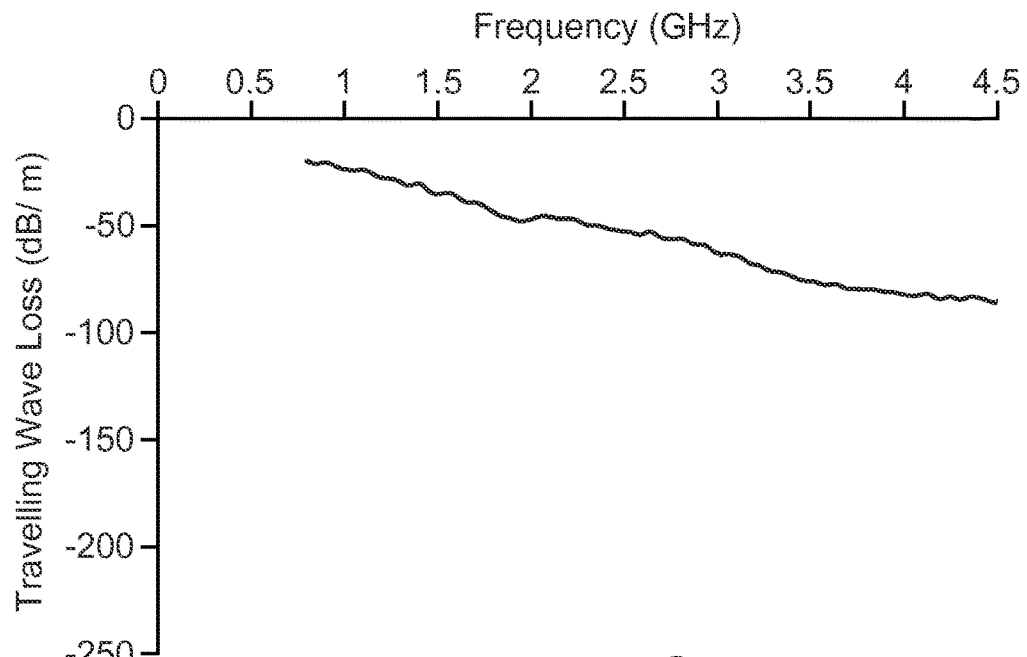
FIG. 7C is a graph showing the measured traveling wave loss versus frequency for the same body as that of FIGS. 7A and 7B.

The traveling wave loss versus frequency was measured for the same Example 1 sample using the same dielectric measurement technique described earlier, and the results are shown in FIG. 7C. The results demonstrate that the composite material of this Example can decrease EMI interference waves at the frequencies shown.

Example 2: Composites with PVDF Matrix Material and Dielectrically Lossy TiO Fillers Measured quantities of high purity TiO and PVDF polymer powders were melt blended in a glass beaker at T=250° C. for 10 minutes on a hot plate. A drop of Fluorosurfactant FC-4430 was added to the mixture. The resulting mixture was poured onto an aluminum plate (1-2 mm thick and 10 cm×10 cm in size) separated by a spacer and hot-pressed at T=200° C., under a load of 58.84 kN for 15 minutes in a Carver Laboratory press (Model no. 2699, obtained from Carver Inc., Wabash, Ind.).

The hot-pressed composite was then allowed to cool down to room temperature where it hardened into a solid, and was then cut into a toroidal body having an outer diameter of 2.54 cm, an inner diameter of 1.10 cm, and a thickness (or height or length) of 2 to 3 mm. The amount of TiO in the composite was about 54.09 wt. %, which corresponds to about 30 vol. % loading. Complex dielectric properties were calculated over the GHz frequency range using an Agilent E8363C Network Analyzer coupled to a Damaskos Model 100T Air Coaxial test fixture.

Figure 8A:
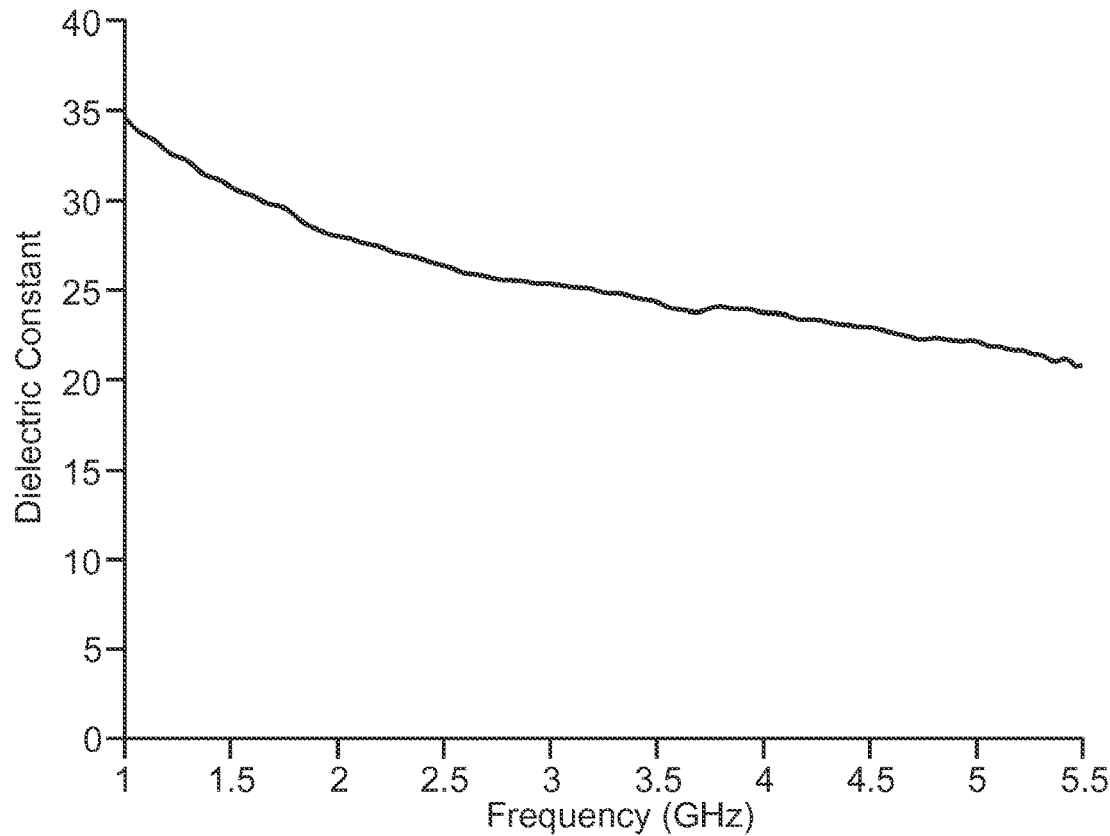
FIG. 8A is a graph showing the measured dielectric constant versus frequency for a body made from a composite material having PVDF (polyvinylidene fluoride) as the matrix material and TiO ceramic particles dispersed therein at 30 vol. %.
Figure 8B:
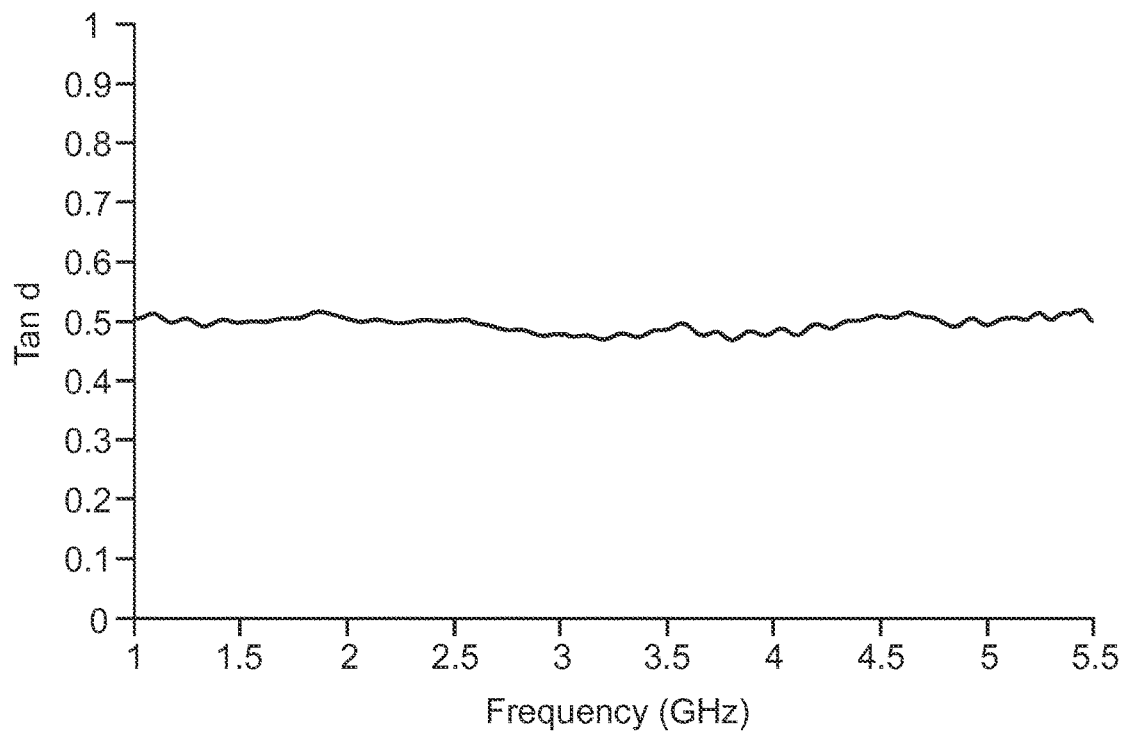
FIG. 8B is a graph showing the measured dielectric loss tangent versus frequency for the same body as that of FIG. 8A.

FIGS. 8A and 8B show the measured dielectric response of the Example 2 TiO/PVDF composite material from 1 GHz to 5.5 GHz. The base polymer PVDF by itself, with no TiO filler, has a dielectric constant (Dk) of about 3.0 over the measured frequency range (from 1 GHz to 5.5 GHz) and has a dielectric loss tangent (tan d) of about 0.1 to 0.08 over the same gigahertz frequency range.

Comparative Example: Epoxy Control Sample

Epoxy was obtained from ITW Devcon, Danvers, Mass. 10 g of this two part epoxy (1:1 weight ratio) was put in a small plastic jar and put in a speed mixer (DAC 150 FVZ, Siemens, spun at rpm=2000 for 2 mins.). The mix was placed in an oven pre-set at 80° C. for 4 hours.

Once the epoxy sample (100 wt % epoxy) was completely cured, the sample was taken out of the plastic jar (used as a mold). The composite sample was then machined into toroid or doughnut shaped sample (outer diameter=0.275 inch (0.70 cm) and inner diameter=0.120 inch (0.30 cm), thickness=3-6 mm) samples for electromagnetic co-axial measurements.

Complex dielectric and magnetic properties were calculated over the frequency range of 0.1 to 18 GHz from S parameters using an Agilent E8363C Network Analyzer coupled to a Damaskos Model M07T Air Coaxial test fixture using the doughnut shaped samples at room temperature.

Example 3: Composites with Epoxy Matrix Material and Dielectrically Lossy TiO Fillers To high purity TiO powders (7.8 g), 1 wt % hydrophobic nanosilica was added using dry speed mixing technique. The resulting mixture was added to epoxy (2.2 g) in a small plastic jar and put in a speed mixer (DAC 150 FVZ, Siemens, spun at 2000 rpm for 2 minutes) to make composites. The mix was placed in an oven pre-set at 80° C. for 4 hours. Once the epoxy composite was completely cured, the composite mix was taken out of the plastic jar (which was used as a mold). The composite sample was then machined into a toroid (i.e., a doughnut) shaped sample (outer diameter=0.275 inch (0.70 cm) and inner diameter=0.120 inch (0.30 cm), thickness=3-6 mm) samples for electromagnetic co-axial measurements.

Complex dielectric and magnetic properties were calculated over the frequency range of 0.1 to 18 GHz from S parameters using an Agilent E8363C Network Analyzer coupled to a Damaskos Model M07T Air Coaxial test fixture using the doughnut shaped samples at room temperature.

Figure 9:
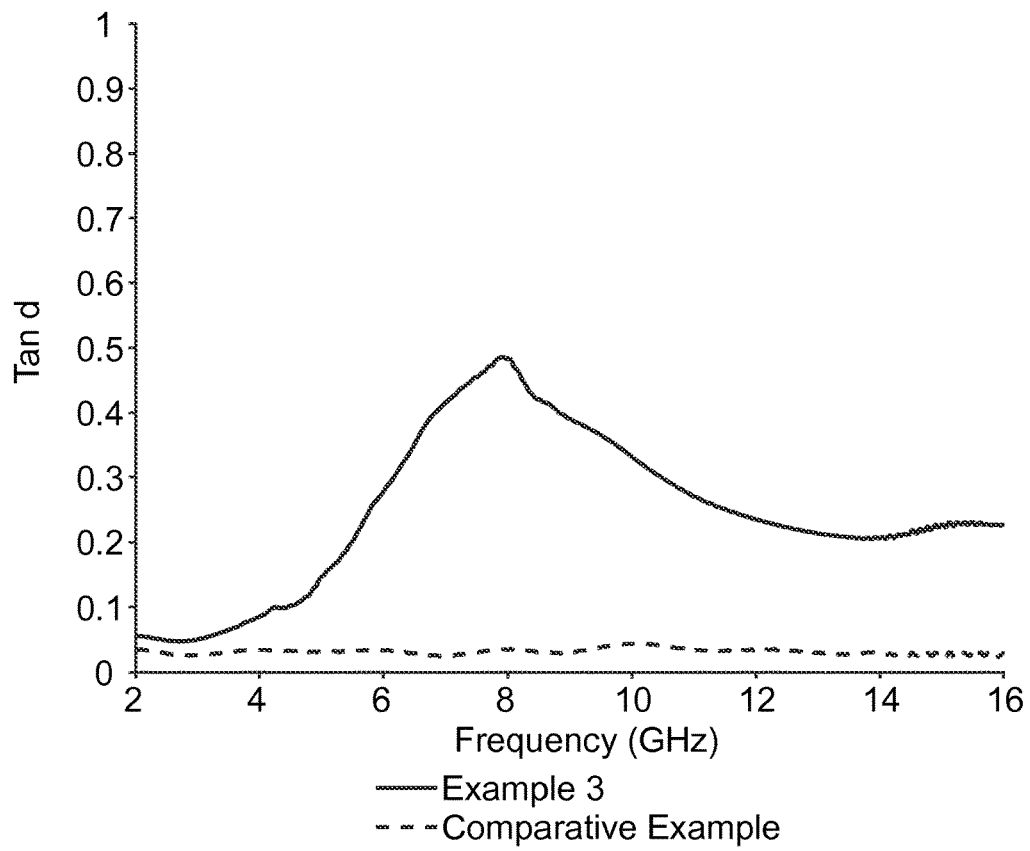
FIG. 9 is a graph showing the measured dielectric constant versus frequency for a body made from a composite material having an epoxy matrix with TiO and nanosilica dispersed therein and a body made from epoxy alone.

FIG. 9 shows the measured dielectric response tan of the Example 3 and Comparative Example A composite material from 2 GHz to 16 GHz. The dielectric constant, tan, magnetic permeability and tan (magnetic) of Example 3 are compared to those of other Examples in FIGS. 11-14.

Example 4: Composites with Epoxy Matrix Material and TiO-YIG Fillers

Stoichiometric amount of TiO powders (20 g) were mixed (homogenized for 30 minutes) with YIG powders (20 g) using an Model IKA ULTRA-TURRAX T-25 homogenizer (available from IKA Works, Inc., Wilmington, N.C.) in a glass beaker using ethanol as a medium. The ratio of TiO to YIG was kept at 1:1 (weight ratio). Once the mixing was complete, the mixture (TiO-YIG) was dried. To this mixture, 1 wt % hydrophobic nanosilica was added using dry speed mixing technique. The resulting mixture was added to epoxy (2.2 g) in a small plastic jar and put in a speed mixer to make composites. The mix was placed in an oven pre-set at 80° C. for 4 hours. Once the epoxy composite was completely cured, the composite mix was taken out of the plastic jar (used as a mold). The composite sample was then machined into toroid or doughnut shaped sample (outer diameter=0.275 inch (0.70 cm) and inner diameter=0.120 inch (0.30 cm), thickness=3-6 mm) samples for electromagnetic co-axial measurements.

Complex dielectric and magnetic properties were calculated over the frequency range of 0.1 to 18 GHz from S parameters using an Agilent E8363C Network Analyzer coupled to a Damaskos Model M07T Air Coaxial test fixture using the doughnut shaped samples at room temperature.

The dielectric constant, tan, magnetic permeability and tan (magnetic) of Example 4 are compared to those of other Examples in FIGS. 11-14.

Example 5: Composites with Epoxy Matrix Material and TiO-CIP Fillers

Example 5 samples were prepared in the same manner as Example 4 samples except that 20 g of CIP powders were used instead of 20 g of YIG powders to make the filler materials.

Complex dielectric and magnetic properties were calculated over the frequency range of 0.1 to 18 GHz from S parameters using an Agilent E8363C Network Analyzer coupled to a Damaskos Model M07T Air Coaxial test fixture using the doughnut shaped samples at room temperature.

Figure 10:
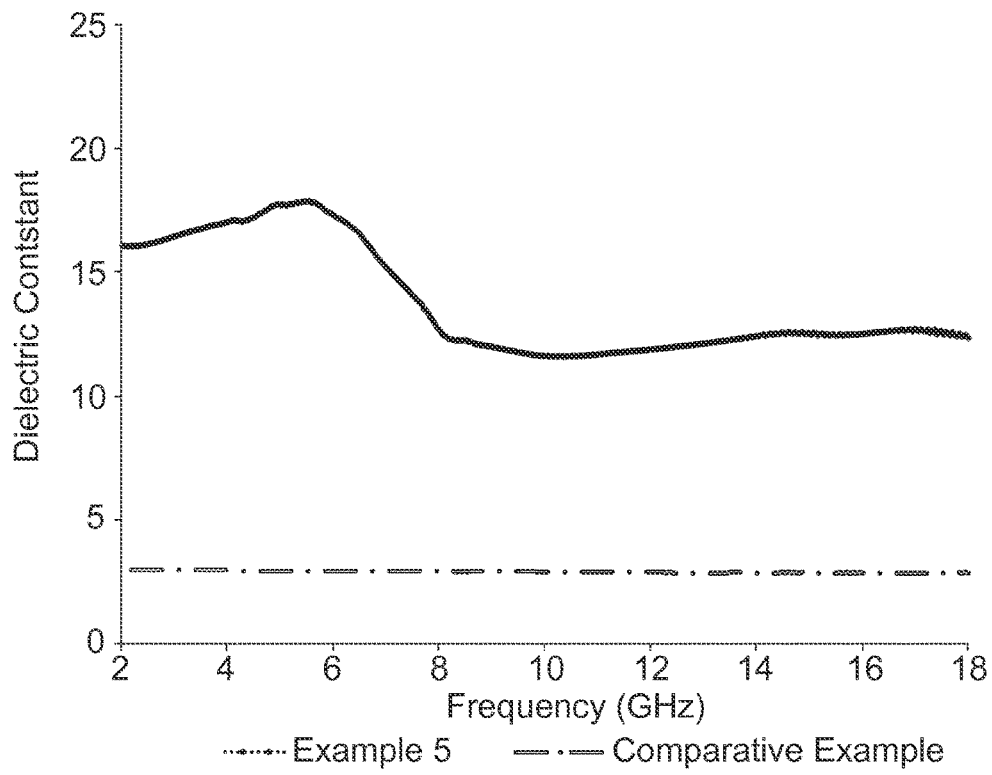
FIG. 10 is a graph showing the measured dielectric constant versus frequency for a body made from a composite material having an epoxy matrix with TiO and carbonyl iron powder dispersed therein and for a body made from epoxy alone.
Figure 11:
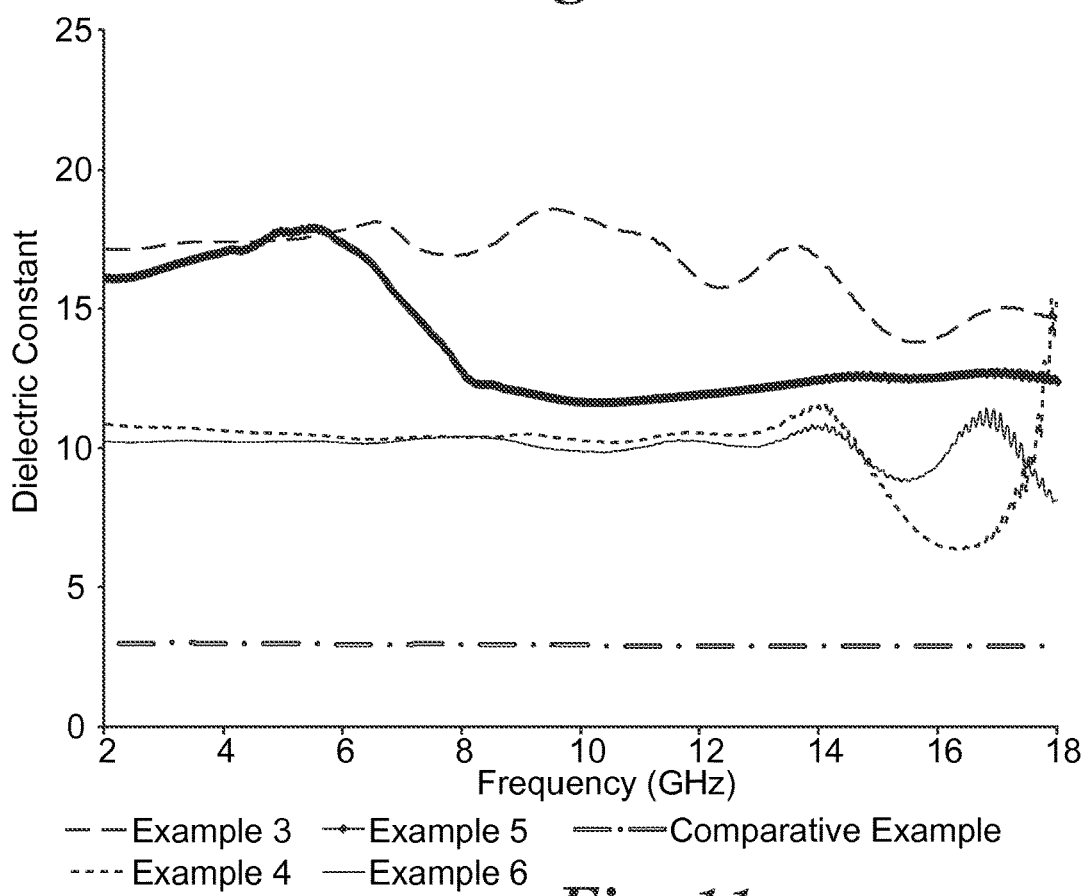
FIG. 11 is a graph showing the measured dielectric constant versus frequency for a body made from a composite material having an epoxy matrix with TiO and nanosilica dispersed therein, a body made from a composite material having an epoxy matrix with TiO and $Y_3Fe_5O_{12}$ powder dispersed therein, a body made from a composite material having an epoxy matrix with TiO and carbonyl iron powder dispersed therein, a body made from a composite material having an epoxy matrix with TiO and $Ba_3Co_2Fe_{24}O_{41}$ powder dispersed therein, and a body made from epoxy alone.
Figure 12:
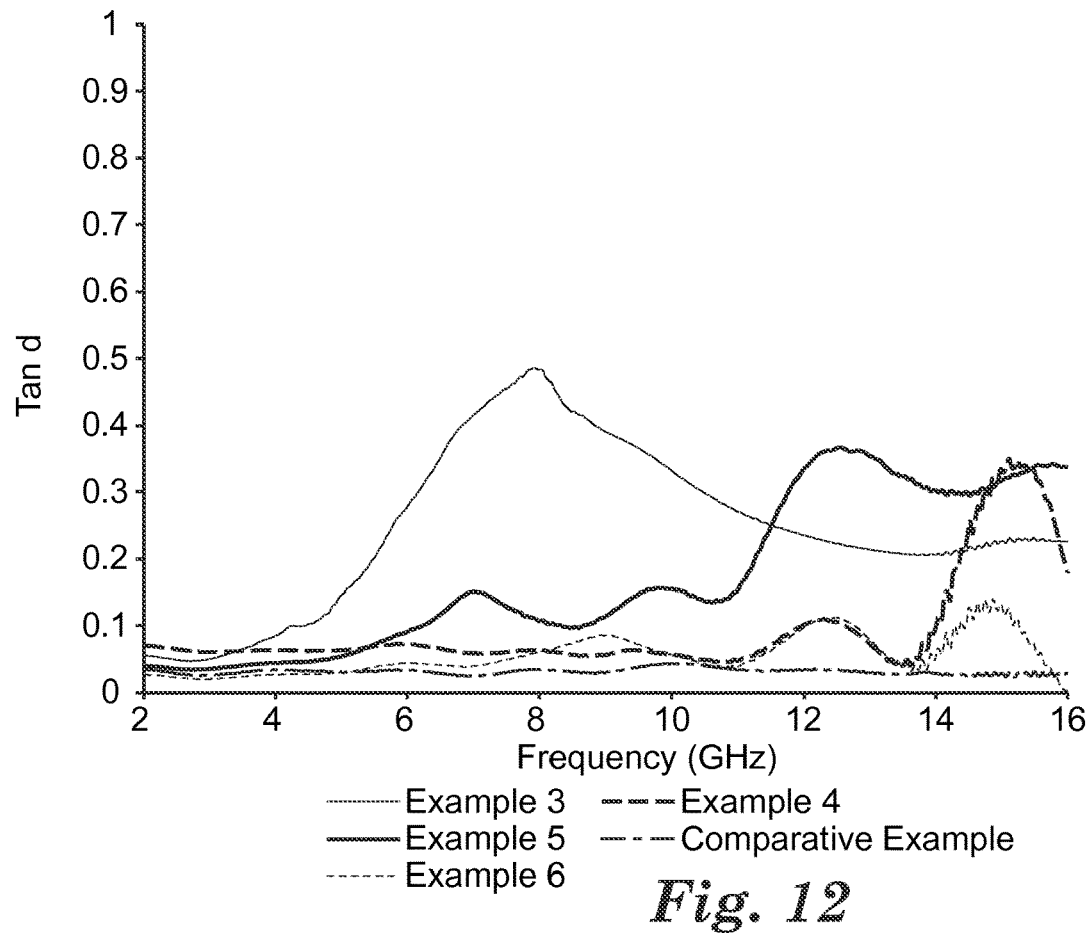
FIG. 12 is a graph showing the dielectric loss tangent versus frequency for the same bodies as those of FIG. 11.
Figure 13:
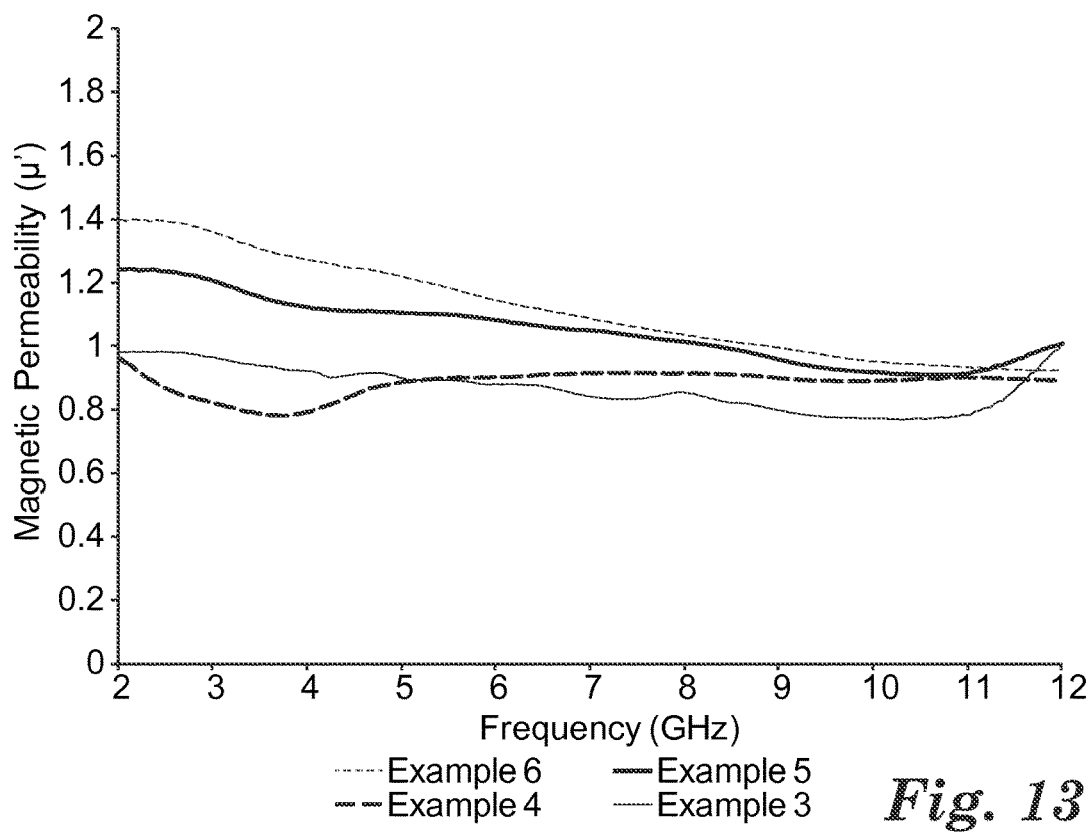
FIG. 13 is a graph showing the real part of magnetic permeability versus frequency for a body made from a composite material having an epoxy matrix with TiO and nanosilica dispersed therein, a body made from a composite material having an epoxy matrix with TiO and $Y_3Fe_5O_{12}$ powder dispersed therein, a body made from a composite material having an epoxy matrix with TiO and carbonyl iron powder dispersed therein, and a body made from a composite material having an epoxy matrix with TiO and $Ba_3Co_2Fe_{24}O_{41}$ powder dispersed therein.
Figure 14:
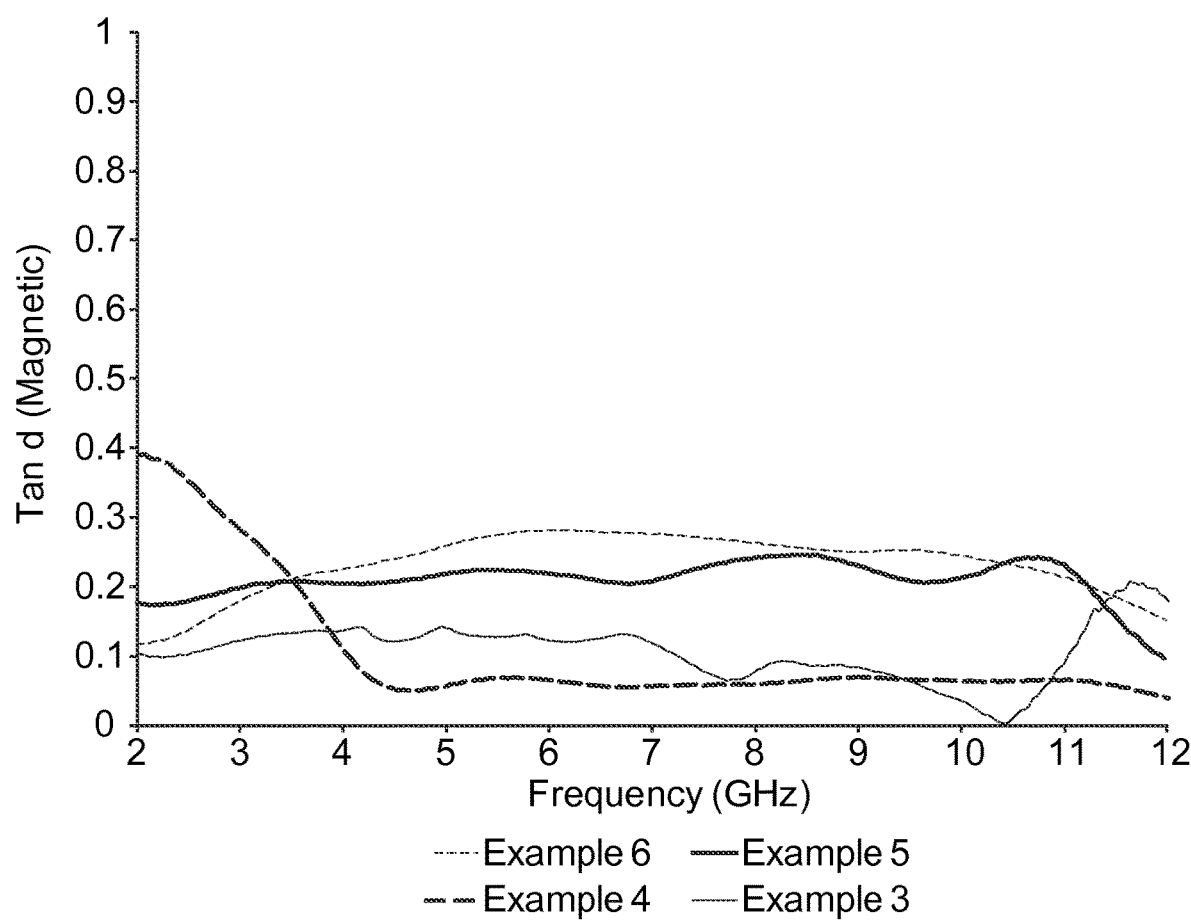
FIG. 14 is a graph showing the imaginary part of magnetic permeability versus frequency for the same bodies as those of FIG. 13.

FIG. 10 shows the measured dielectric response tan of the Example 5 and Comparative Example A composite material from 2 GHz to 18 GHz. The dielectric constant, tan, magnetic permeability and tan (magnetic) of Example 5 are compared to those of other Examples in FIGS. 11-14.

Example 6: Composites with Epoxy Matrix Material and TiO—$Co_2Z$ Ferrite Fillers Example 6 samples were prepared in the same manner as Example 4 samples except that 20 g of $Co_2Z$ ferrite powders were used instead of 20 g of YIG powders to make the filler materials.

Complex dielectric and magnetic properties were calculated over the frequency range of 0.1 to 18 GHz from S parameters using an Agilent E8363C Network Analyzer coupled to a Damaskos Model M07T Air Coaxial test fixture using the doughnut shaped samples at room temperature.

The dielectric constant, tan, magnetic permeability and tan (magnetic) of Example 3 are compared to those of other Examples in FIGS. 11-14.

Various modifications and alterations of this invention will be apparent to those skilled in the art without departing from the spirit and scope of this invention, and it should be understood that this invention is not limited to the illustrative embodiments set forth herein. The reader should assume that features of one disclosed embodiment can also be applied to all other disclosed embodiments unless otherwise indicated. Also, while the disclosure often uses singular forms such as "a," "an," and "the" for convenience, it should be understood that the singular is meant to include the plural unless the singular alone is explicitly specified or it is clear from the context that the singular alone is called for. Further, all U.S. patents, patent application publications, journal article, references, and other patent and non-patent documents referred to herein are incorporated by reference in their entirety and for all purposes.

What is claimed is:

1. A composition comprising a composite material, the composite material comprising: a matrix material; and ceramic particles dispersed within the matrix material; wherein the ceramic particles comprise electrically conductive titanium monoxide (TiO), wherein the composite material has a dielectric loss tangent of at least 0.03 over a range from 1 GHz to 60 GHz; wherein the composite material is a mitigating electromagnetic interference (EMI) material.

2. The composition of claim 1, wherein the composite material comprises from 10 vol. % to 60 vol. % of the particles.

3. The composition of claim 1, wherein the composite material has a dielectric loss tangent of at least 0.15.

4. A composition of claim 1, wherein the dielectric loss tangent has a first loss tangent component due to the ceramic particles and a second loss tangent component due to the matrix material, and wherein the first loss tangent component is at least 0.1.

5. A composition of claim 4, wherein the second loss tangent component is at least 0.01.

6. A composition of claim 1, further comprising one or more additional components.

7. A composition of claim 1, wherein one or more additional components include at least one of nanosilica, carbonyl iron, $Ba_3Co_3Fe_{24}O_{41}$, and $Y_3Fe_5O_{12}$.

8. A composition of claim 1, wherein the matrix material comprises a polymeric matrix material.

9. The composition of claim 1, wherein the composite material has a magnetic loss tangent of at least 0.03.

10. The composition of claim 1, wherein the composite material has a combination of dielectric and magnetic loss tangent of at least 0.03.

11. The composition of claim 1 where the composition is a component of a notch filter for EMI suppression.

12. A composition of claim 1, wherein the composition is present as a component of a flexible EMI shielding layer.

13. A composition of claim 1 wherein the composition is present as a component of an EMI shielding layer that at least partially surrounds one or more conductive lines of a cable comprising the one or more conductive lines.

14. A composition of claim 1, wherein the composition is in the form of a rigid body having a contoured shape.

15. A composition of claim 1 in the form of an ink for mitigating electromagnetic interference and is adapted for printing on a workpiece.

16. A composition of claim 15, wherein the matrix material comprises a polymer and wherein the matrix material is dissolved in a solvent.

17. A method of shielding an electronic device from electromagnetic interference, comprising: providing an electronic device; and placing a composition of claim 1 in proximity to the electronic device.

18. A method of claim 17, wherein the placing comprises forming an EMI shielding article in situ proximate the electronic device.

* * * * *